US009534423B2

(12) United States Patent
Calkins

(10) Patent No.: US 9,534,423 B2
(45) Date of Patent: Jan. 3, 2017

(54) ACCESSORY LOCK FOR COMPUTING DEVICE

(71) Applicant: Apple Inc., Cupertino, CA (US)

(72) Inventor: Alexander C. Calkins, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 108 days.

(21) Appl. No.: 14/216,660

(22) Filed: Mar. 17, 2014

(65) Prior Publication Data

US 2015/0159405 A1 Jun. 11, 2015

Related U.S. Application Data

(60) Provisional application No. 61/913,833, filed on Dec. 9, 2013.

(51) Int. Cl.
*H05K 7/00* (2006.01)
*H05K 5/00* (2006.01)
*E05B 73/00* (2006.01)

(52) U.S. Cl.
CPC ...... *E05B 73/0082* (2013.01); *Y10T 29/49826* (2015.01); *Y10T 70/80* (2015.04)

(58) Field of Classification Search
CPC ....................................................... G06F 1/187
USPC ....................................... 361/679.01–679.03
See application file for complete search history.

(56) References Cited

U.S. PATENT DOCUMENTS

2006/0000961 A1* 1/2006 Wei-Chieh ............. G06F 1/187 248/223.41
2009/0213535 A1* 8/2009 Zhang .................... G11B 33/02 361/679.31

* cited by examiner

*Primary Examiner* — Jerry Wu
(74) *Attorney, Agent, or Firm* — Downey Brand LLP

(57) ABSTRACT

The described embodiments relate to a locking mechanism for securing a housing of a computing device. More specifically, the disclosed embodiments are configured to both secure the housing of the computing device closed and to provide a means for securing the desktop computing device to a stationary object such as a desk. The locking mechanism can be two separable locking bodies configured to be received by separate openings in a housing of the computing device. Once the separate openings receive both locking bodies, a locking device can engage both pieces of the locking mechanism to lock both pieces to each other and to the housing.

20 Claims, 7 Drawing Sheets

ACCESSORY LOCK FOR COMPUTING DEVICE

CROSS-REFERENCE TO RELATED APPLICATIONS

The present application claims the benefit of U.S. Provisional Application No. 61/913,833, entitled "ACCESSORY LOCK FOR COMPUTING DEVICE" filed Dec. 9, 2013, the content of which is incorporated herein by reference in its entirety for all purposes.

FIELD

The described embodiments relate generally to computing device locking mechanisms. More particularly, the present embodiments relate to a locking mechanism for preventing the opening of a computing device and securing the computing device at a location.

BACKGROUND

Advances in portable computing devices have allowed desktop sized computing devices to be continually reduced in size. Unfortunately, as size and weight of these devices has been reduced, these devices become increasingly more susceptible to misappropriation. In some environments, intrusion into the casing of a computing device can be a concern for an owner of the computing device. Unfortunately, devices configured to secure laptop computing devices may not be compatible with desktop computing devices because many desktop computing devices lack suitable openings to receive a lock.

SUMMARY

The various embodiments described herein relate to locking mechanisms for securing a computer housing. Specifically, in some embodiments, the locking mechanism includes a first lock body comprising a first lock opening and a first hook. The locking mechanism also includes a second lock body comprising a second lock opening and a second hook. The first lock opening and second lock opening are configured to align and receive a locking device for joining together the first lock body and second lock body. Additionally, the first hook is configured to engage a first opening in a first housing of the computing device. The second hook is configured to engage a second opening in a second housing of the computing device.

In yet another embodiment of the locking mechanism, the locking mechanism includes a first lock body having a first lock opening and a first hook. The locking mechanism also includes a second lock body comprising a second lock opening and a plurality of second hooks. Additionally, the first lock body can include a first alignment feature (or also referred to as "mating feature") and the second lock body can include a second alignment feature (or also referred to as "indentation") such that when the second alignment feature receives the first alignment feature a flush surface is created by the first lock body and the second lock body.

A method set forth herein discloses configuring a locking mechanism to be received by a first housing portion and a second housing portion of a computing system. The method includes the steps of: configuring the locking mechanism to have a first lock body and a second lock body, and forming a first opening in the first lock body and a second opening in the second lock body. The method can further include the steps of adapting the first lock body to be received by a first opening of the first housing portion, and adapting the second lock body to be received by a second opening of the second housing portion.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
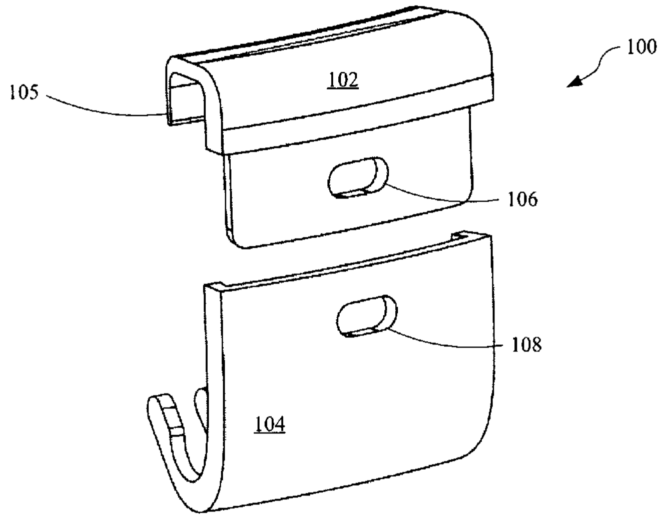
FIG. 1A shows a front view of a multi-part locking mechanism suitable for securing a small form factor desktop computing device.

Representative applications of methods and apparatus according to the present application are described in this section. These examples are being provided solely to add context and aid in the understanding of the described embodiments. It will thus be apparent to one skilled in the art that the described embodiments can be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments can be used, and changes can be made without departing from the spirit and scope of the described embodiments.

Portable computers, such as laptop computers, can include attachment features that are secured to cables to keep the devices in place. However, desktop computers are generally heavier and have historically been less susceptible to misappropriation. As desktop computing devices become increasingly more portable, safeguarding such units becomes increasingly important. Furthermore, many desktop computing devices include features allowing them to be easily opened, creating a concern for users who wish to prevent others from opening their computer. To better safeguard such computing devices, a locking mechanism can be securely latched onto external features of the desktop computing device. The locking mechanism can provide an attachment feature to which a security cable or tie down can be firmly attached. Furthermore, the locking mechanism can prevent intrusion into the desktop computing device by coupling together portions of the housing that can be separated to access internal components of the desktop computing device.

The locking mechanism for securing the internal components of a computing device having a multi-part housing is set forth in further detail and in various embodiments described herein. In some embodiments, the locking mechanism includes a first lock body comprising a first lock opening and a first hook. The locking mechanism also includes a second lock body comprising a second lock opening and a second hook. The first lock opening and second lock opening are configured to align and receive a locking device for joining together the first lock body and second lock body. Additionally, the first hook is configured to engage a first opening in a first housing of the computing device. The second hook is configured to engage a second opening in a second housing of the computing device. In some embodiments the second lock body comprises a plurality of second hooks. The plurality of second hooks can extend away from the second lock body at an angle less than 90 degrees relative to an opposing end of the second lock body wherein a direction in which the opposing end extends represents 0 degrees. The plurality of second hooks can be configured to receive a vent on a distal end of the housing of the computing device, wherein the vent can include multiple apertures and each second hook is configured to be received by an aperture of the vent.

In one embodiment, the first lock body and second lock body are individual and separable pieces of the locking mechanism that can be joined together. The first lock body can include a first alignment feature and the second lock body can include a second alignment feature, such that the second alignment feature is configured to receive the first alignment feature. When the first alignment feature is completely received by the second alignment feature the first lock opening and the second lock opening at least partially overlap. Furthermore, the second alignment feature is configured to abut the first alignment feature on two surfaces of the first alignment feature, and the partial overlap of the first lock opening and the second lock opening is configured to receive a locking device for securing the first lock body to the second lock body. In some embodiments, the locking mechanism secures a multi-part housing of a computing device that is cylindrical. Moreover, the locking mechanism can include a cable for securing the computing device to a desired location (e.g., a desk).

In yet another embodiment of the locking mechanism, the locking mechanism includes a first lock body having a first lock opening and a first hook. The locking mechanism also includes a second lock body comprising a second lock opening and a plurality of second hooks. Additionally, the first lock body can include a first alignment feature and the second lock body can include a second alignment feature such that when the second alignment feature receives the first alignment feature a flush surface is created by the first lock body and the second lock body. In some embodiments, the plurality of second hooks extend away from the second alignment feature of the second lock body at an angle less than 90 degrees relative to an opposing end of the second lock body and a direction in which the opposing end extends represents 0 degrees. The plurality of second hooks can be configured to receive a vent on a distal end of the housing of the computing device, wherein the vent includes multiple apertures and each second hook is configured to be received by an aperture of the vent. A portion of the first hook can be configured to be parallel to a direction in which an opposing end of the first lock body extends. In one embodiment, the second alignment feature is configured to abut the first alignment feature on two surfaces of the first alignment feature creating a flush surface. The flush surface includes an aperture configured to receive a locking device to secure the first lock body to the second lock body. The flush surface can be a concave surface relative to the housing of the computing device. In some embodiments, the housing of the computing device is cylindrical and can have a cylindrical array of vent apertures into which the second hooks of the second lock body can be inserted.

A method set forth herein discloses configuring a locking mechanism to be received by a first housing portion and a second housing portion of a computing system. The method includes the steps of: configuring the locking mechanism to have a first lock body and a second lock body, and forming a first opening in the first lock body and a second opening in the second lock body. The method can further include the steps of adapting the first lock body to be received by a first opening of the first housing portion, and adapting the second lock body to be received by a second opening of the second housing portion. In some embodiments, the method includes forming a first hook in the first lock body and a second hook in the second lock body, such that the first hook is configured to reside at least partially inside the first housing portion. When forming a second hook in the second lock body, a plurality of second hooks can be formed in the second lock body. Furthermore, the method can include forming a first alignment feature in the first lock body and a second alignment feature in the second lock body, wherein the second alignment feature is configured to receive the first alignment feature. The first alignment feature and second alignment feature can be formed such that when the first alignment feature is completely received by the second alignment feature, a first lock opening and the second lock opening at least partially overlap. In one embodiment, the method includes adapting the first lock opening and the second lock opening to receive a locking device such that when the locking device simultaneously engages the first lock opening and second lock opening, the first lock body and the second lock body become locked together.

These and other embodiments are discussed below with reference to FIGS. 1A-5. However, those skilled in the art will readily appreciate that the detailed description given herein with respect to these figures is for explanatory purposes only and should not be construed as limiting.

Figure 1B:
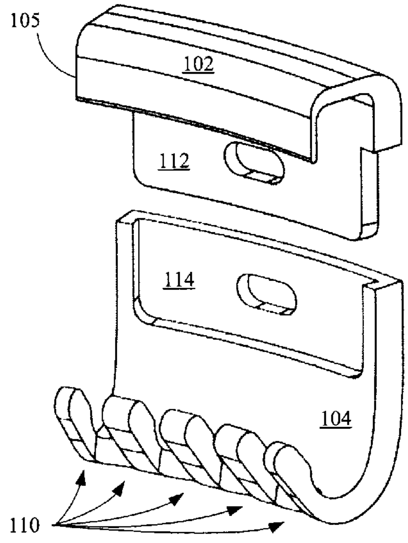
FIG. 1B shows a back view of a multi-part locking mechanism suitable for securing a small form factor desktop computing device.
Figure 1C:
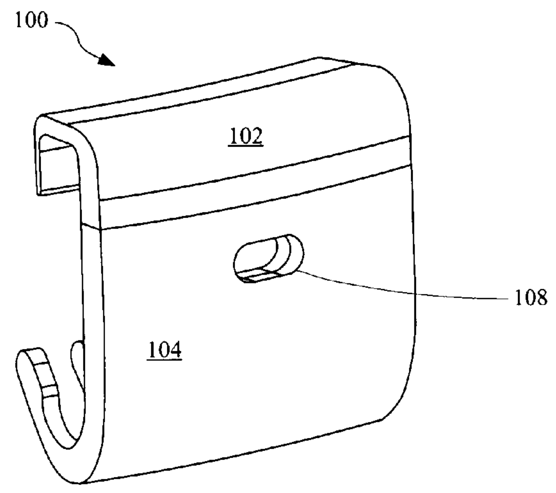
FIG. 1C shows a front view of the first alignment feature of an upper lock body engaged with a second alignment feature of a lower lock body, to align lock openings of the first and second lock bodies.
Figure 1D:
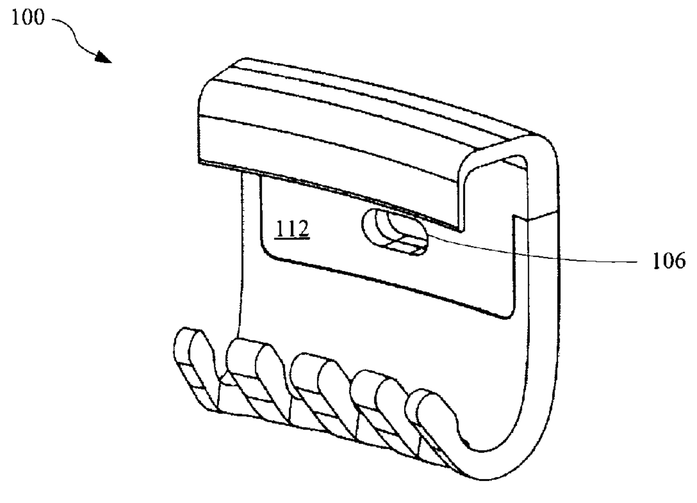
FIG. 1D shows a back view of the first alignment feature of an upper lock body engaged with a second alignment feature of a lower lock body, to align lock openings of the first and second lock bodies.

FIG. 1A shows a front view of a locking mechanism 100 suitable for securing a form factor desktop computing device. Locking mechanism 100 includes upper lock body 102 and lower lock body 104. Upper lock body 102 and lower lock body 104 can be formed from a strong and rigid material such as metal, ceramic, or even hardened plastic. In some embodiments, upper lock body 102 and lower lock body 104 can be formed from a variety of suitable materials. Upper lock body 102 includes first hook 105 configured to engage an opening in a computer housing and first lock opening 106 configured to align with second lock opening 108 of lower lock body 104. FIG. 1B shows the lower lock body 104 having a plurality of second hooks 110 configured to engage regularly spaced vent openings in the computer device. In some embodiments, the plurality of second hooks 110 extend away from a second alignment feature 114 of the lower lock body 104 at an angle less than 90 degrees. The angle of the plurality of the second hooks 110 is relative to the second alignment feature 114 or an opposite end of the lower lock body 104 such that a direction in which the opposite end or second alignment feature 114 extends represents 0 degrees and the angle of the plurality of second hooks 110 is a positive number less than 90 degrees (as shown in FIGS. 1A-1D). Further, upper lock body 102 includes a first alignment feature 112 configured to engage a second alignment feature 114 of lower lock body 104, having a size and shape in accordance with first alignment feature 112. FIGS. 1C and 1D illustrate the first alignment feature 112 engaged with second alignment feature 114 first lock opening 106 and second lock opening 108 to form a single opening between both upper lock body 102 and lower lock body 104.

Figure 2A:
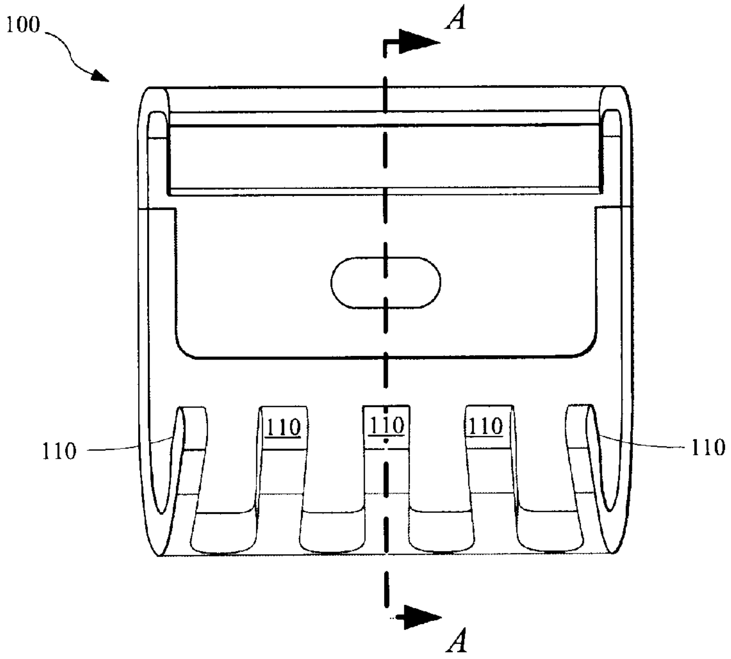
FIG. 2A shows a back view of a locking mechanism.

FIG. 2A shows a back view of locking mechanism 100. FIG. 2A shows a plurality of second hooks 110 oriented towards a central portion of locking mechanism 100 indicated by Section Line A-A. This configuration allows the locking mechanism 100 to engage a computing device housing having an edge complementary to the shape of locking mechanism 100. In some embodiments housing of the computing device can be cylindrical. Moreover, it should be noted that in some embodiments, the locking mechanism 100 can have a linear geometry in which each of the second hooks 110 are oriented substantially parallel to each other. In yet another embodiment, the locking mechanism 100 can have a curvature substantially greater than the one depicted in the figures accompanying this application. In still other embodiments, the locking mechanism 100 can have one or more flat and/or curved portions having a variety of suitable orientations for locking a housing of a computing device.

Figure 2B:
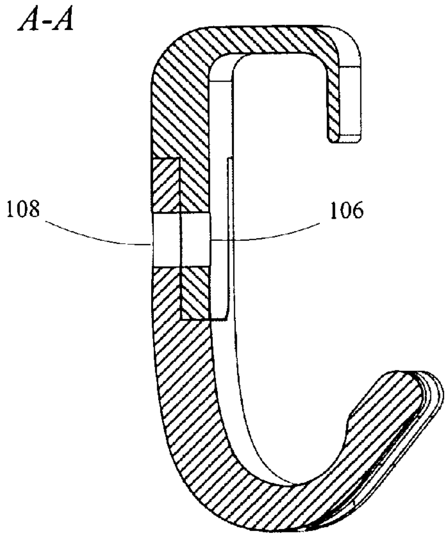
FIG. 2B shows a cross-sectional view of the locking mechanism of FIG. 2A.

FIG. 2B shows a cross-sectional view of locking mechanism 100 in accordance with Section Line A-A of FIG. 2A. FIG. 2B shows how first lock opening 106 and second lock opening 108 can be precisely aligned when first alignment feature 112 is engaged with second alignment feature 114 (as illustrated in FIG. 1B). The depiction of FIG. 2B also shows the slight curvature of locking mechanism 100 which can be modified to secure any suitable computing device (e.g., a cylindrical computing device).

Figure 3:
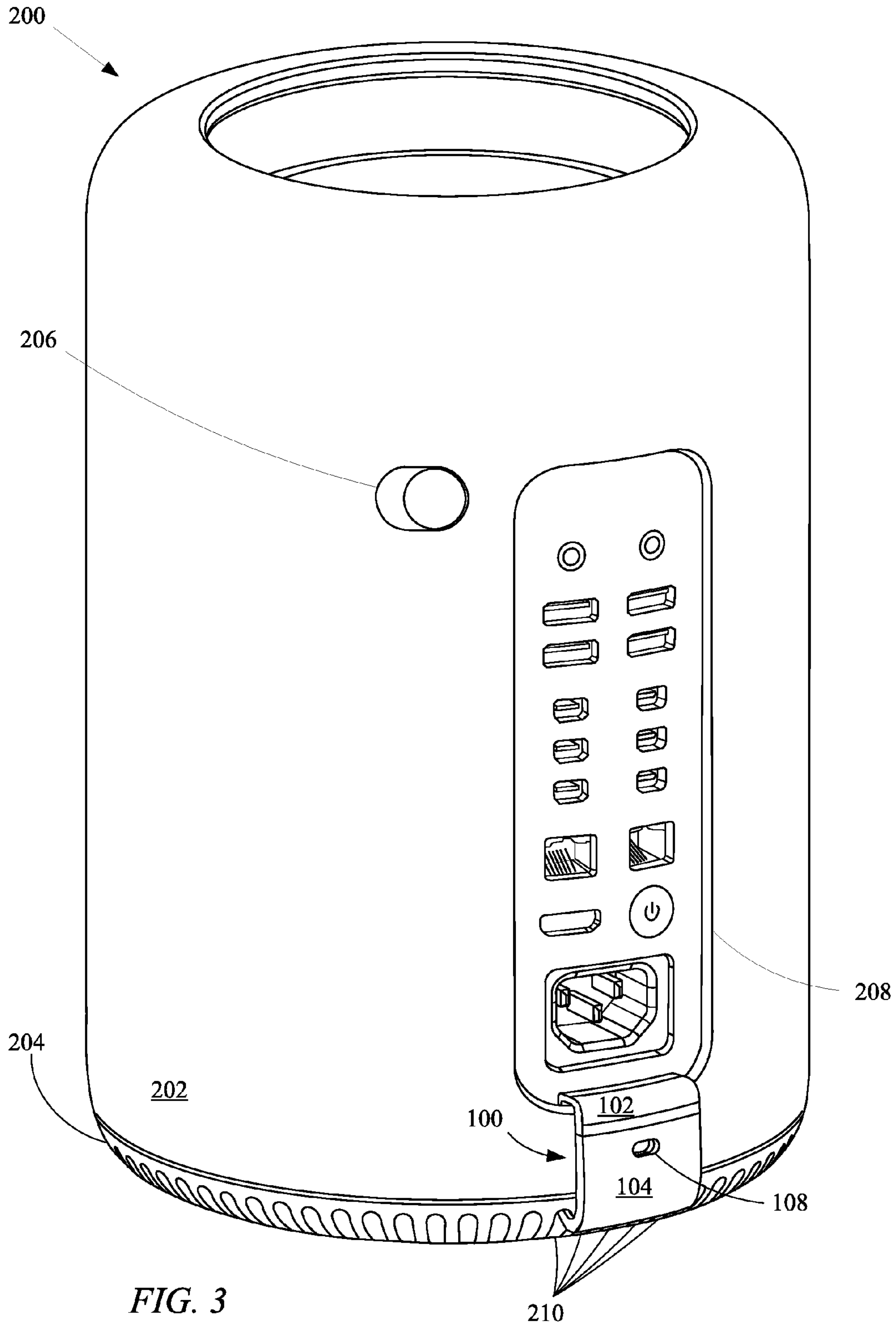
FIG. 3 shows a perspective view of a computing device housing.

FIG. 3 shows a perspective view of representative computer 200 having a substantially cylindrical cover 202 coupled to circular vent system 204. An accessory opening 208 is configured to provide access to various Input/Output (I/O) ports and an assortment of buttons and power inputs. Once cylindrical cover 202 is coupled with circular vent system 204, the interior components of computer 200 are secured inside the computer 200. To further secure computer 200, a locking switch 206 is configured near the top of the accessory opening 208. However, the locking switch 206 does not provide any additional security measures for preventing access to the internal components of computer 200 beyond being merely a mechanical switch operable by anyone. To resolve this deficiency, locking mechanism 100 is engaged with accessory opening 208 and vent openings 210 of circular (or cylindrical) vent system 204. When the locking mechanism 100 receives a security key (not shown) in second lock opening 108, the locking mechanism 100 further secures the housing of computer 200 by coupling cylindrical cover 202 with the circular vent system 204. In order to unlock the locking mechanism 100, one must use a security key or pass that unlocks the locking mechanism 100, thus providing further security for the computer 200.

Figure 4A:
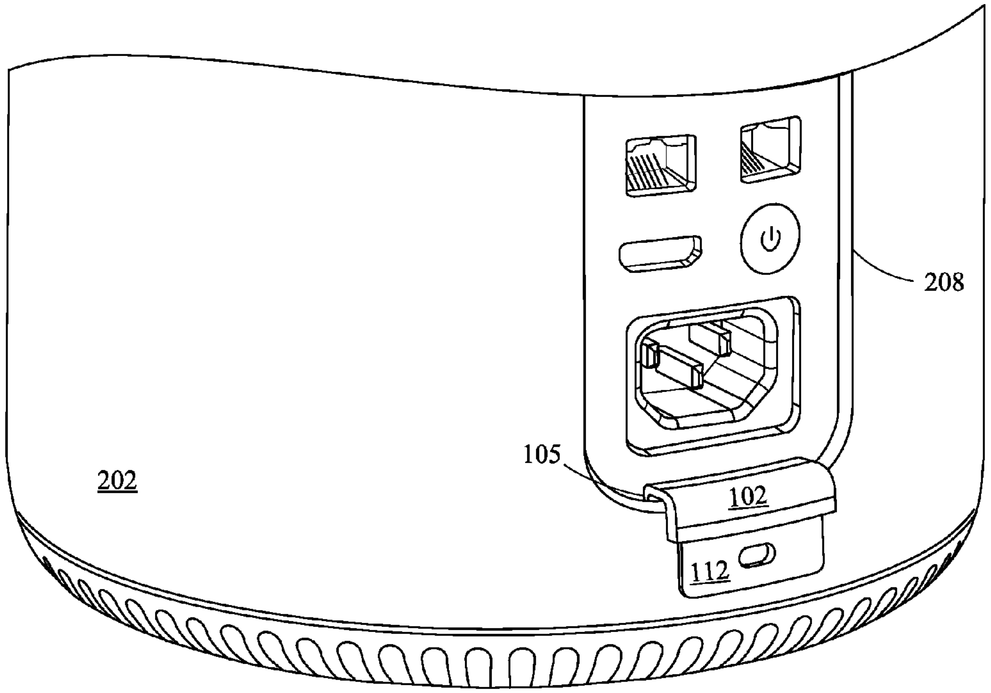
FIG. 4A show partial perspective view of the first lock body attached to a lower portion of the computing device housing of FIG. 3.
Figure 4B:
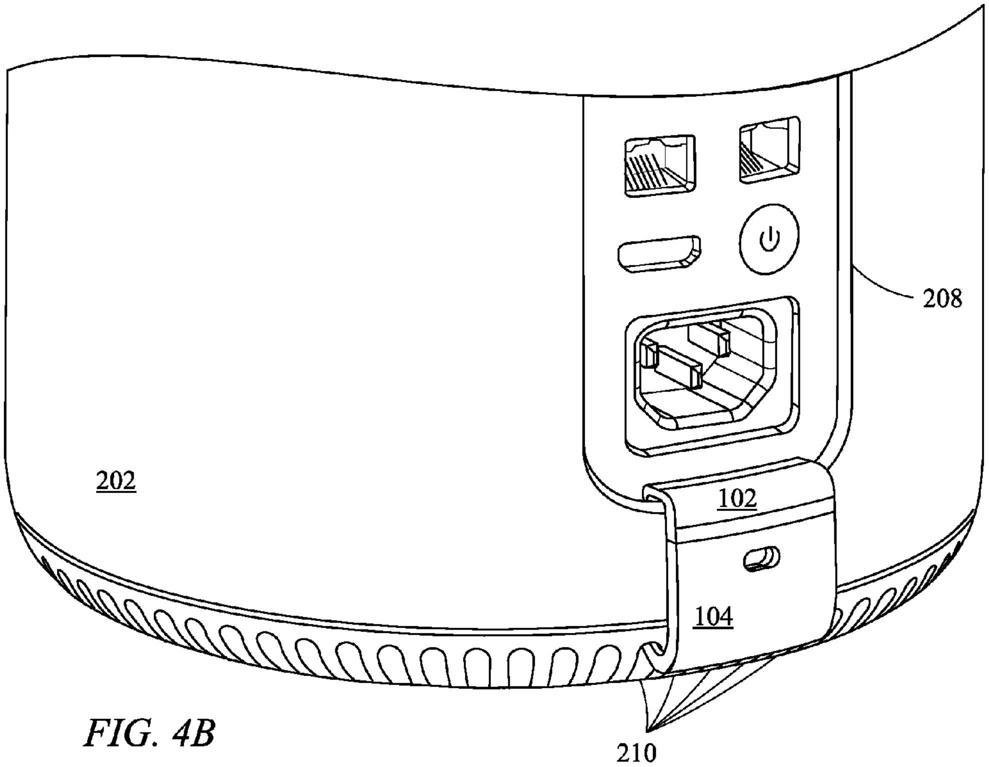
FIG. 4B shows a partial perspective view of both the first lock body and second lock body attached to the lower portion of the computing device housing of FIG. 3.

FIGS. 4A-4B show partial perspective views of a lower portion of computer 200. FIG. 4A shows the upper lock body 102 engaged within accessory opening 208, by first hook 105. After first hook 105 is engaged with accessory opening 208, as illustrated in FIG. 4B, the plurality of second hooks 110 of lower lock body 104 can be engaged with accessory opening 208 (e.g., air vents). The second alignment feature 114 of lower lock body 104 can be engaged with first alignment feature 112 of the upper lock body 102 so that first lock opening 106 and second lock opening 108 of upper lock body 102 and lower lock body 104 can be aligned or at least partially overlap.

Figure 4C:
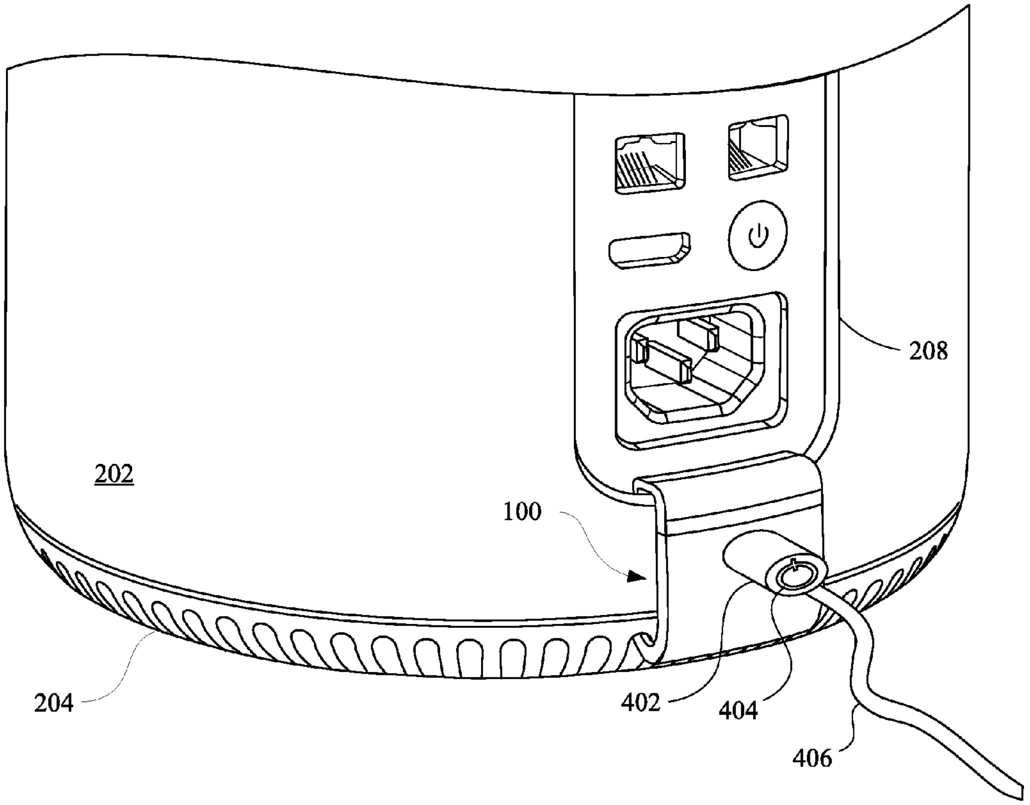
FIG. 4C shows a partial perspective view of a cable, a locking device, and the locking mechanism attached to the lower portion of the computing device housing of FIG. 3.

FIG. 4C shows how locking device 402 can engage first lock opening 106 and second lock opening 108 (not shown) to secure locking device 402 to locking mechanism 100, thus coupling cylindrical cover 202 with the circular vent system 204. Key opening 404 allows a security key (not shown) to securely engage locking device 402 within first lock opening 106 and second lock opening 108. While a circular key opening 404 is depicted, it should be noted that any shaped key opening could be utilized to secure locking device 402 to first lock opening 106 and second lock opening 108. Furthermore, cable 406 can be couple to locking device 402 or any suitable portion of locking mechanism 100, to secure computer 200 in a desired location. In some embodiments, locking device 402 can be a combination lock or other suitable lock requiring a unique security key, code, pass, or any other suitable security measure (e.g., finger print, card, magnetic key, retina scan, audio verification, etc.). Additionally, the security key can be controlled by the computer 200, a remote computer, or server.

Figure 5:
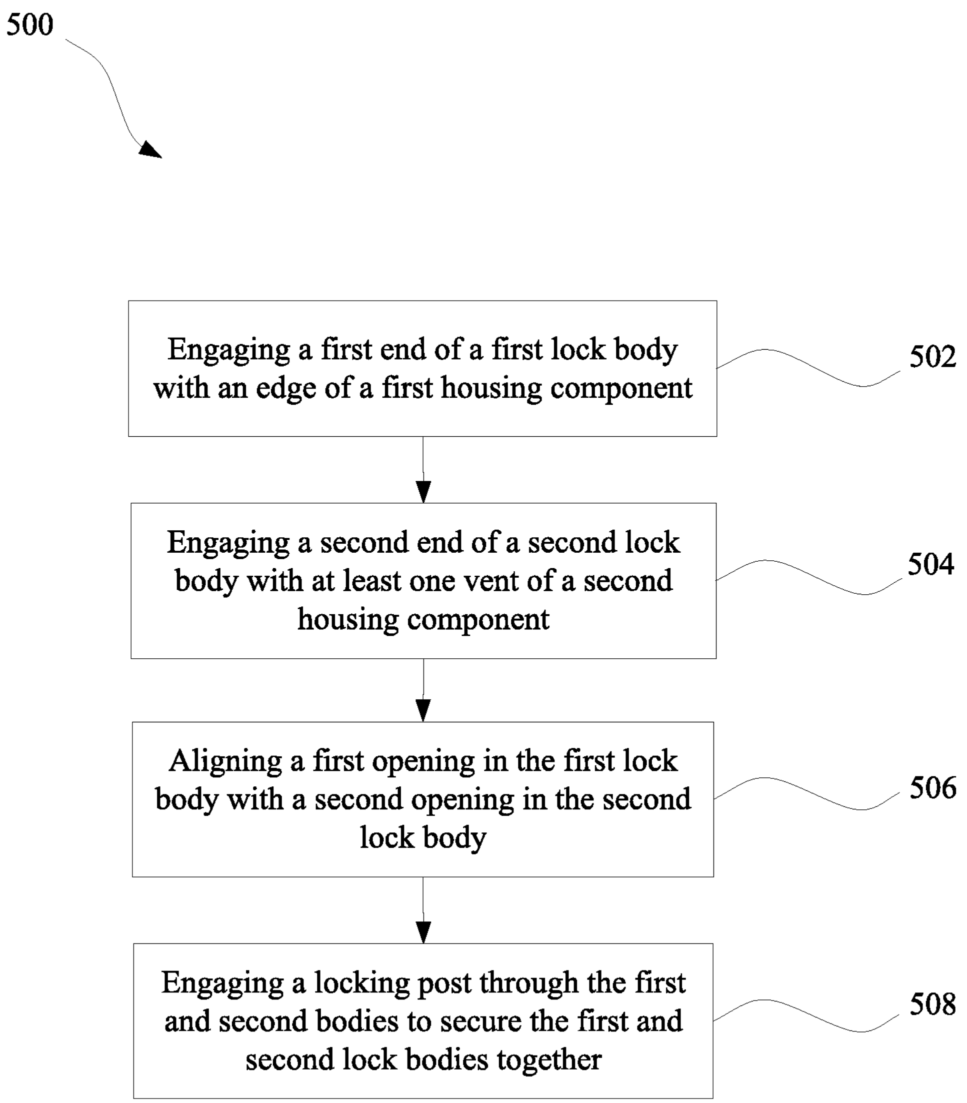
FIG. 5 shows a block diagram depicting a method for engaging a multi-part locking mechanism with a computing device housing.

FIG. 5 shows a block diagram depicting a method 500 for engaging a locking mechanism with a computer housing. At a first step 502, a first end of an upper lock body is engaged within an opening of a first housing component. At step 504, a second end of a lower lock body is engaged within an opening of a second housing component. At step 506, a first opening of the upper lock body is aligned with a second opening of a lower lock body. At step 508, a portion of a locking device passes through a lock opening of each of the lock bodies to join the lock bodies securely together while being engaged with the openings of the first and second housing components. The locking device can be locked within the openings by a key to prevent unauthorized removal of the locking mechanism. It should be noted that alternatively the lower lock body could be attached before the upper lock body, or concurrently with attachment of the upper lock body. In some embodiments, the method includes engaging a multi-part locking mechanism, single-part locking mechanism, or a locking mechanism having more than two parts (e.g., an upper lock body, a lower lock body, and a middle lock body). In yet another embodiment, the locking mechanism engages only one housing component to secure the internal components of the computer from being accessed (e.g., where a computer housing is one piece that allows for opening of the computer housing through a single portion of the computer housing, and can be locked by any suitable locking mechanism described herein).

The various aspects, embodiments, implementations or features of the described embodiments can be used separately or in any combination. Various aspects of the described embodiments can be implemented by software, hardware or a combination of hardware and software. The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A locking mechanism that locks together a first cylindrical part and a second cylindrical part of a multi-part cylindrically shaped housing of a computing device preventing unauthorized access, the first cylindrical part having an opening that allows authorized access to an input/output panel, the second cylindrical part including a pedestal that supports the computing device, the pedestal having vent openings that allow air passage, the locking mechanism comprising:

- a first lock body having a shape that conforms to the first cylindrical part, the first lock body including a first lock opening and a first hook, the first hook configured to at least partially wrap around the first cylindrical part and engage the opening of the first cylindrical part in a locked position;
- a second lock body having a shape that conforms to the second cylindrical part and the first lock body, the second lock body comprising a second lock opening and multiple hooks, the multiple hooks configured to pass through the vent openings and grasp the pedestal in the locked position;
- a locking device that secures together the first lock body and the second lock body in the locked position, wherein in the locked position, the first lock opening and the second lock opening align to create a through-hole configured to receive the locking device simultaneously through both the first lock body and the second lock body.

2. The locking mechanism of claim 1, wherein the first lock opening is located at a first end of the first lock body, the second lock opening is located at a second end of the second lock body, and a thickness of each of the first end and the second end is less than a length of the through-hole.

3. The locking mechanism of claim 1, wherein the through-hole is located between the multiple hooks when the first and second lock bodies are secured together.

4. The locking mechanism of claim 1, wherein each of the first lock body and the second lock body are curved in accordance with the multi-part cylindrically shaped housing.

5. The locking mechanism of claim 1, wherein the first lock body and second lock body are individual and separable pieces.

6. The locking mechanism of claim 1, wherein the first lock body and the second lock body are configured to extend at least partially within the multi-part housing of the computing device when the first lock body and the second lock body are in the locked position.

7. The locking mechanism of claim 6, wherein the multi-part housing of the computing device is cylindrical.

8. The locking mechanism of claim 1, wherein the locking device is attached to a cable for securing the computing device to a desired location.

9. A locking mechanism for securing a computing device having a circular housing and a circular base, the circular housing having an accessory opening and the circular base having a circular vent system, the locking mechanism comprising:

- a first lock body that conforms to the circular housing, the first lock body comprising a first hook that engages the circular housing at the accessory opening and an extension that includes a first lock opening; and
- a second lock body that conforms to the circular base, the second lock body comprising a second hook that engages the circular vent system and a slot configured to receive the extension, the slot including a second lock opening, wherein
  - the first lock opening and the second lock opening are configured to align to create a through-hole configured to receive a locking device simultaneously through both the first lock body and the second lock body.

10. The locking mechanism of claim 9, wherein the first lock opening is located at a first end of the first lock body, the second lock opening is located at a second end of the second lock body, and a thickness of each of the first end and the second end is less than a length of the through-hole.

11. The locking mechanism of claim 9, further comprising a plurality of second hooks wherein the plurality of second hooks are configured to be received by a vent of the housing of the computing device, wherein the vent includes multiple apertures and each second hook is configured to be received by an aperture of the vent.

12. The locking mechanism of claim 9, wherein the through-hole extends through the extension and the slot when the first lock body and second lock body are secured together.

13. The locking mechanism of claim 9, wherein the slot is configured to abut the extension on two surfaces of the extension.

14. The locking mechanism of claim 9, wherein the second hook extends through an opening of the circular vent system.

15. The locking mechanism of claim 14, wherein the locking device comprises a key opening and a cable removably coupled with the first lock body and the second lock body by the locking device.

16. A method for configuring a locking mechanism to be received by a multi-part cylindrically shaped housing of a computing device, the multi-part cylindrically shaped housing comprising a first cylindrical part and a second cylindrical part, the first cylindrical part having an opening that allows authorized access to an input/output panel, the second cylindrical part including a pedestal that supports the computing device, the pedestal having vent openings that allow air passage, the method comprising:

- forming a first lock body having a shape that conforms to the first cylindrical part, the first lock body comprising a first hook that around the first cylindrical part and engages the opening of the first cylindrical part, the first lock body further comprising a first lock opening;

forming a second lock body having a shape that conforms to the second cylindrical part and the first lock body, the second lock body comprising a second lock opening and multiple hooks, the multiple hooks configured to pass through the vent openings and grasp the pedestal, wherein the first lock opening and the second lock opening are configured to align to create a through-hole configured to receive a locking device simultaneously through both the first lock body and the second lock body.

17. The method of claim 16, wherein the first hook is configured to reside at least partially inside the first cylindrical part of the multi-part housing of the computing device.

18. The method of claim 17, wherein each of the first lock body and the second lock body are curved in accordance with the multi-part cylindrically shaped housing.

19. The method of claim 17, further comprising:

forming a first alignment feature in the first lock body and a second alignment feature in the second lock body, wherein the second alignment feature is configured to receive the first alignment feature.

20. The method of claim 19, wherein the first lock opening is located at a first end of the first lock body, the second lock opening is located at a second end of the second lock body, and a thickness of each of the first end and the second end is less than a length of the through-hole.

* * * * *